United States Patent
Brug et al.

Patent Number: 6,072,717
Date of Patent: Jun. 6, 2000

[54] STABILIZED MAGNETIC MEMORY CELL

[75] Inventors: James A. Brug, Menlo Park; Thomas C. Anthony, Sunnyvale; Manoj K. Bhattarcharyya, Cupertino, all of Calif.

[73] Assignee: Hewlett Packard, Palo Alto, Calif.

[21] Appl. No.: 09/146,819

[22] Filed: Sep. 4, 1998

[51] Int. Cl.$^7$ ........................................ G11C 11/14
[52] U.S. Cl. .................................. 365/171; 365/173
[58] Field of Search ................................ 365/171, 173, 365/158; 257/421, 422; 438/3

[56] References Cited

U.S. PATENT DOCUMENTS

| | | | |
|---|---|---|---|
| 5,650,958 | 7/1997 | Gallagher | 365/171 |
| 5,748,524 | 5/1998 | Chen et al. | 365/173 |
| 5,756,366 | 5/1998 | Berg et al. | 437/48 |
| 5,825,685 | 10/1998 | Yamane | 365/158 |

*Primary Examiner*—A. Zarabian

[57] ABSTRACT

A stabilized magnetic memory cell including a data storage layer having an interior region and a pair of end regions near a pair of opposing edges of the data storage layer and a stabilizing material that pins a magnetization in the end regions to a predetermined direction. A method for stabilizing a magnetic memory cell includes the steps of applying a magnetic field that rotates a magnetization in a pair of opposing side regions of a data storage layer of the magnetic memory cell toward a predetermined direction and that reduces free poles in a pair of opposing end regions of the magnetic memory cell, thereby reducing the likelihood of unpredictable switching behavior in the end regions.

10 Claims, 4 Drawing Sheets

STABILIZED MAGNETIC MEMORY CELL

BACKGROUND OF THE INVENTION

1. Field of Invention

The present invention pertains to the field of magnetic memories. More particularly, this invention relates to providing a stabilized magnetic memory cell in a magnetic memory.

2. Art Background

A magnetic memory such as a magnetic random access memory (MRAM) typically includes an array of magnetic memory cells. Each magnetic memory cell usually includes a data storage layer and a reference layer. The data storage layer is usually a layer or film of magnetic material that stores magnetization patterns in orientations that may be altered by the application of external magnetic fields. The reference layer is usually a layer of magnetic material in which the magnetization is fixed or "pinned" in a particular direction.

The magnetization pattern in the data storage layer of a magnetic memory cell typically consists of two distinct regions of magnetization—its interior region and its edge regions. The magnetization in the interior region usually aligns with what is commonly referred to as the easy axis of the data storage layer. The magnetization in the edge regions tend to align along the corresponding edges. The overall orientation of magnetization in the data storage layer of a magnetic memory cell results from the magnetization in the interior region as well as the magnetization in the edge regions.

Typically, the state of a magnetic memory cell depends on the relative orientations of magnetization in its data storage and reference layers. A magnetic memory cell is typically in a low resistance state if the overall orientation of magnetization in its data storage layer is parallel to the orientation of magnetization in its reference layer. In contrast, a magnetic memory cell is typically in a high resistance state if the overall orientation of magnetization in its data storage layer is anti-parallel to the orientation of magnetization in its reference layer.

Typically, the logic state of a bit stored in a magnetic memory cell is written by applying external magnetic fields that alter the overall orientation of magnetization in the data storage layer. The external magnetic fields may be referred to as switching fields that switch a magnetic memory cell between its high and low resistance states. A stabilized magnetic memory cell may be defined as one that remains in its high or low resistance state until switched by a well defined switching field.

The manufacturing process for a magnetic memory commonly creates surface irregularities near the edges of the data storage layers of individual magnetic memory cells. For example, such surface irregularities may be caused by inaccuracies in the patterning steps that form the edges of the data storage layers. This effect usually becomes more pronounced as smaller elements are formed at the limit of lithography used to achieve higher storage densities in a magnetic memory. Unfortunately, such surface irregularities may render individual magnetic memory cells unstable. For example, such surface irregularities may cause magnetic patterns in the edge regions of a data storage layer which have unpredictable or random orientations and switching behavior.

One prior solution for minimizing these negative effects is to form each data storage layer as a rectangle with an elongated dimension along its easy axis. Such a structure usually increases easy axis contribution to the resulting orientation of magnetization in the data storage layer in comparison to contributions from the edges. Unfortunately, such a rectangular configuration usually requires more energy to flip the orientation of magnetization in the data storage layer during write operations, thereby causing increase power consumption in an MRAM that uses such a structure. In addition, such rectangular magnetic memory cells usually limit the overall memory cell density that may be obtained in an MRAM.

SUMMARY OF THE INVENTION

A stabilized magnetic memory cell is disclosed including a data storage layer having an interior region and a pair of end regions near a pair of opposing edges of the data storage layer. The stabilized magnetic memory cell includes a stabilizing material that pins the magnetization in the end regions to a predetermined direction, thereby eliminating randomly oriented patterns of magnetization in the end regions which results in predictable switching behavior of the magnetic memory cell.

A method is also disclosed for stabilizing a magnetic memory cell that uses a sequence of write fields to eliminate the randomly oriented patterns of magnetization in the edge regions of the magnetic memory cell.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1A:
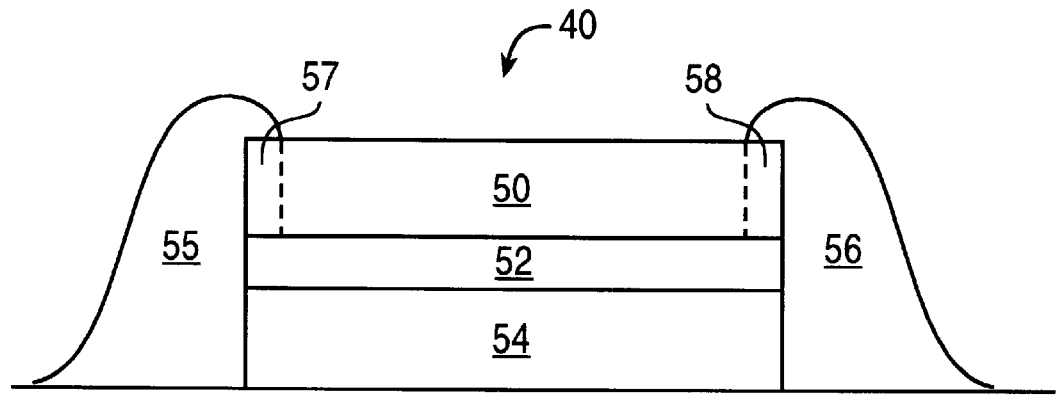
FIGS. 1a–1b illustrate one embodiment of a stabilized magnetic memory cell.
Figure 1B:
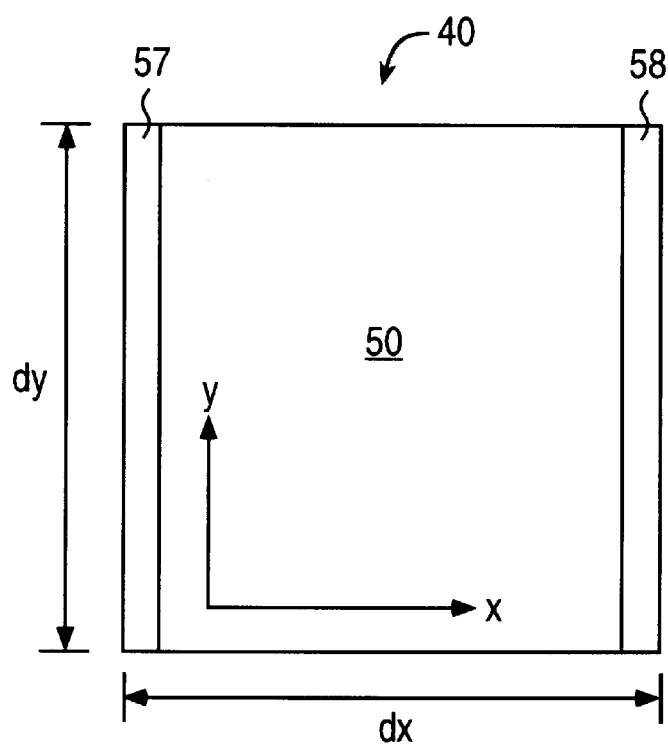

FIGS. 1a–1b illustrate one embodiment of a stabilized magnetic memory cell 40. The magnetic memory cell 40 includes a data storage layer 50 that stores alterable magnetic fields and a reference layer 54 having a pinned orientation of magnetization. The magnetic memory cell 40 further includes layers of stabilizing material 55–56 which pin the orientation of magnetization in a pair of end regions 57–58 near opposing edges of the data storage layer 50.

In this embodiment, the magnetic memory cell 40 includes a tunnel barrier 52 between the data storage layer 50 and the reference layer 54. This structure of the magnetic memory cell 40 may be referred to as a spin tunneling device in that electrical charge migrates through the tunnel barrier 52 during read operations. This electrical charge migration through the tunnel barrier 52 is due to a phenomenon known as spin tunneling and occurs when a read voltage is applied to the magnetic memory cell 40. In an alternative embodiment, a giant magneto-resistive (GMR) structure may be used in the magnetic memory cell 40.

FIG. 1a shows a cross-sectional side view of the magnetic memory cell 40. FIG. 1b shows a cut-away top view of the magnetic memory cell 40. The end regions 57–58 correspond to a pair of opposing edges of the data storage layer 50 which are perpendicular to the easy axis of the data storage layer 50. The easy axis of the data storage layer 50 is parallel to an x axis shown.

In one embodiment, the stabilizing material 55–56 pins the orientation of magnetization in the end regions 57–58 in a direction which is substantially parallel to a y axis. In an alternative embodiment, the stabilizing material 55–56 pins the orientation of magnetization in the end regions 57–58 in a direction which is substantially anti-parallel to the y axis.

The stabilizing material 55–56 not only pins the orientation of magnetization in the end regions 57–58 but also provides insulation for the edges of the layers 50–54 and prevent electrical coupling to conductors which are used to provide read and write access to the magnetic memory cell 40. In one embodiment, the stabilizing material 55–56 is a nickel-oxide material which provides antiferromagnetic properties to pin the end regions 57–58 and provides suitable insulating properties. In other embodiments, other antiferromagnetic materials such as $Fe_2O_3$ or permanent magnet materials may be used for the stabilizing material 55–56.

In embodiments in which the magnetic memory cell 40 is a GMR structure, the insulating properties of the stabilizing material 55–56 may not be needed so materials such as nickel-manganese are suitable. In such embodiments, the stabilizing material 55–56 would serve as conductors for adjacent GMR cells as well as pinning materials for edges of individual GMR cells.

In one embodiment, the dimensions $d_x$ and $d_y$ are selected to be substantially equal and form a square shape for the data storage layer 50. The square shape of the data storage layer 50 enhances the density that may be obtained in an MRAM in comparison to that which may be obtained when using rectangular memory cells. This is so because for a given minimum feature size more square magnetic memory cells may be formed on a given substrate area than rectangular magnetic memory cells. In other embodiments, rectangular shapes may be used.

The reference layer 54 may be a permalloy layer such as nickel-iron (NiFe) which is coupled to an antiferromagnetic layer that pins the orientation of magnetization in the permalloy layer. The antiferromagnetic material may be iron-manganese (FeMn) or nickel-manganese (NiMn). Alternative materials for the antiferromagnetic material include NiO, TbCo, PtMn, and IrMn.

Figure 2A:
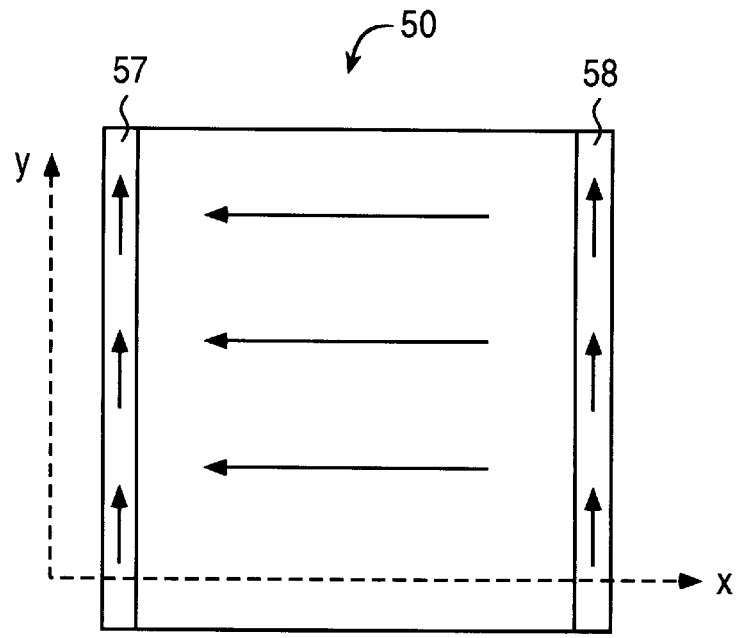
FIGS. 2a–2b illustrate the orientations of magnetization in the data storage layer for the two stabilized states of the magnetic memory cell.
Figure 2B:
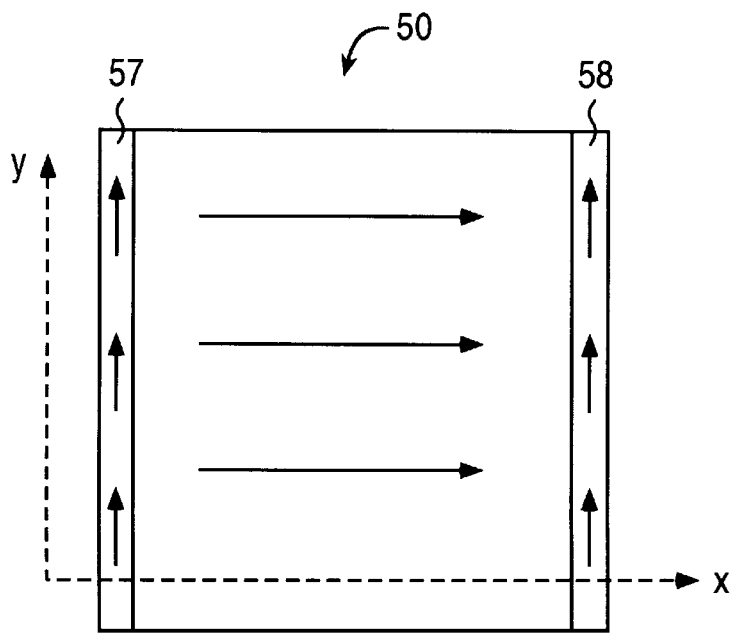

FIGS. 2a–2b illustrate the orientations of magnetization in the data storage layer 50 for the two stabilized states of the magnetic memory cell 40. FIG. 2a shows a first stabilized state and FIG. 2b shows a second stabilized state.

The magnetization in the interior of the data storage layer 50 rotates about the x axis and the easy axis of the data storage layer 50 in response to applied switching fields. The magnetization in the interior of the data storage layer 50 are oriented substantially anti-parallel to the x axis in the first stabilized state and are oriented substantially parallel to the x axis in the second stabilized state.

The magnetic fields in the end regions 57–58 are pinned in a direction that is substantially perpendicular to the easy axis of the data storage layer 50. This prevents one of the first or second stabilized states from being preferred over or more stable than the other.

Figure 3:
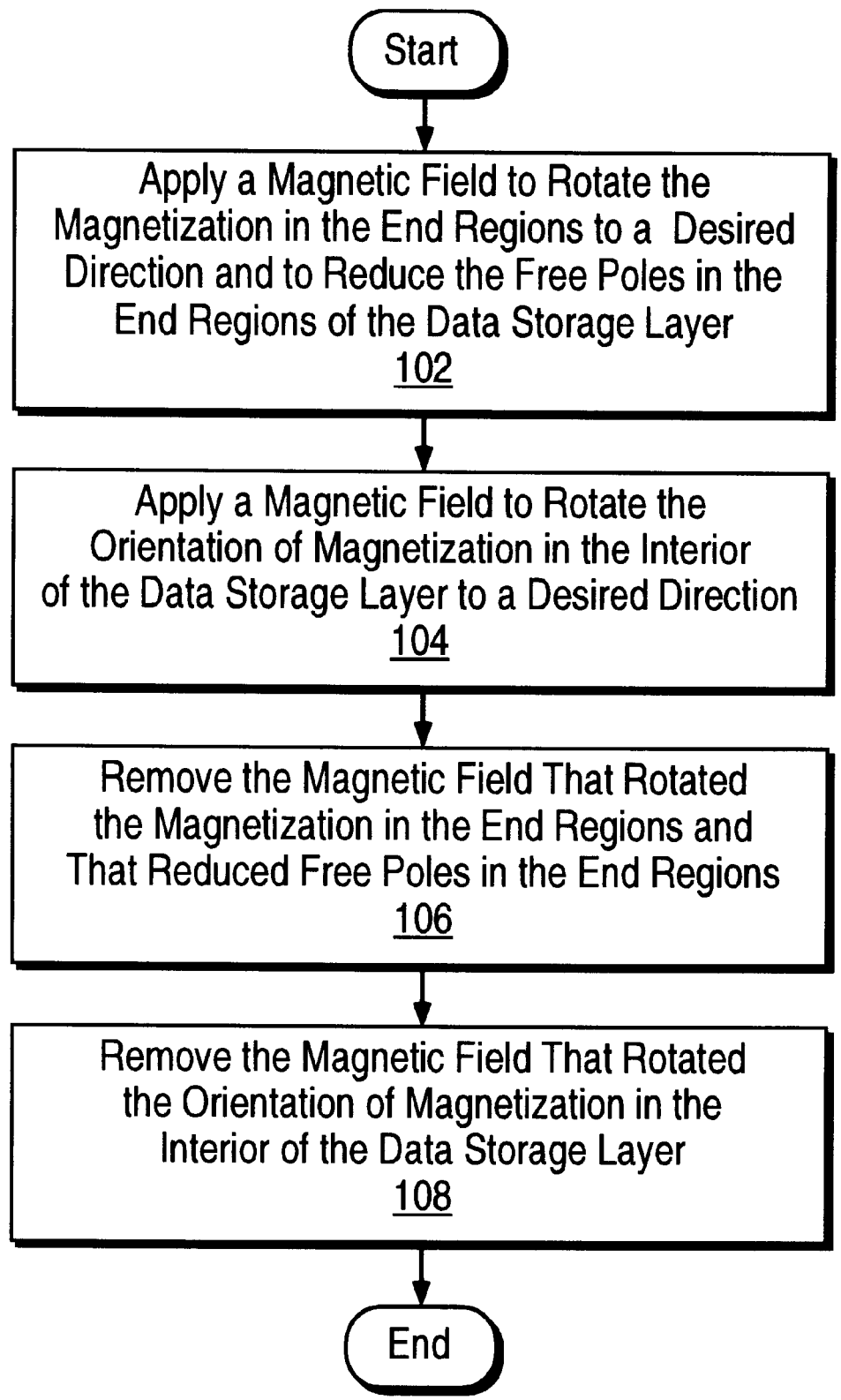
FIG. 3 shows a method for stabilizing a magnetic memory,-cell.

FIG. 3 shows a method for stabilizing the magnetic memory cell 40. This method uses a bias field to minimize the small regions of randomly oriented patterns of magnetization in the data storage layer 50 before a switching field is applied. The bias field reduces the number of free poles in the side regions of the data storage layer 50 which reduces nucleation sites for undesirable domains. The side regions of the data storage layer 50 are the regions near the opposing edges of the data storage layer 50 which are parallel to the easy axis.

The method for stabilizing the magnetic memory cell 40 which includes steps 100–106 is set forth for an example in which the orientation of magnetization in the interior of the data storage layer 40 is substantially in the positive x direction and the orientation of magnetization in the end regions 57–58 is in the positive y direction.

At step 102, a magnetic field is applied to rotate the magnetization in the end regions 57–58 towards a desired direction and to reduce the free poles in the end regions 57–58. In one embodiment, the desired direction is in the positive y direction. In the example, the magnetic field applied at step 102 is a field in the positive y direction ($H_{y+}$). The reversal of magnetization proceeds by rotation rather than domain nucleation because the magnetization in the side regions of the data storage layer 50 is in the positive x direction at the start of step 102. The $H_{y+}$ field affects the end regions 57–58 as a bias field to reduce the number of free poles and align the magnetization in the end regions 57–58 in the positive y direction.

At step 104, a magnetic field is applied to rotate the orientation of magnetization in the interior of the data storage layer 50 towards a desired logic state. This step writes the magnetic memory cell 40 to its desired first or second logic state of a corresponding bit. In this example, the orientation of magnetization is rotated to the negative x direction using a field applied in negative x direction ($H_{x-}$). After step 104, the magnetization in the end regions 57–58 and in the side regions of the data storage layer 50 are largely in the positive y direction. Reversal of magnetization is by magnetization rotation rather than domain nucleation. The overall magnetization in the data storage layer after step 104 is closest to the negative x direction and the easy axis.

At step 106, the magnetic field applied at step 102 is removed. The magnetization in the interior region of the data storage layer 50 becomes largely oriented along the x axis.

At step 108, the magnetic field applied at step 104 is removed. The magnetization in the data storage layer 50 remains in the direction that defined the desired logic state, which in the example is the negative x direction.

In another embodiment, prior to step 102 a magnetic field is applied to reduce the free poles in the side regions of the data storage layer 50. The direction of the magnetic field is determined by reading the current state of the bit. The field is applied in the same direction as the current state of the bit. In this example, the magnetic field applied at step 100 is a field in the positive x direction ($H_{x+}$)

The method steps 100–108 may be employed on the magnetic memory cell 40 whether or not the end regions 57–58 are pinned as shown in FIGS. 1a–1b.

Figure 4:
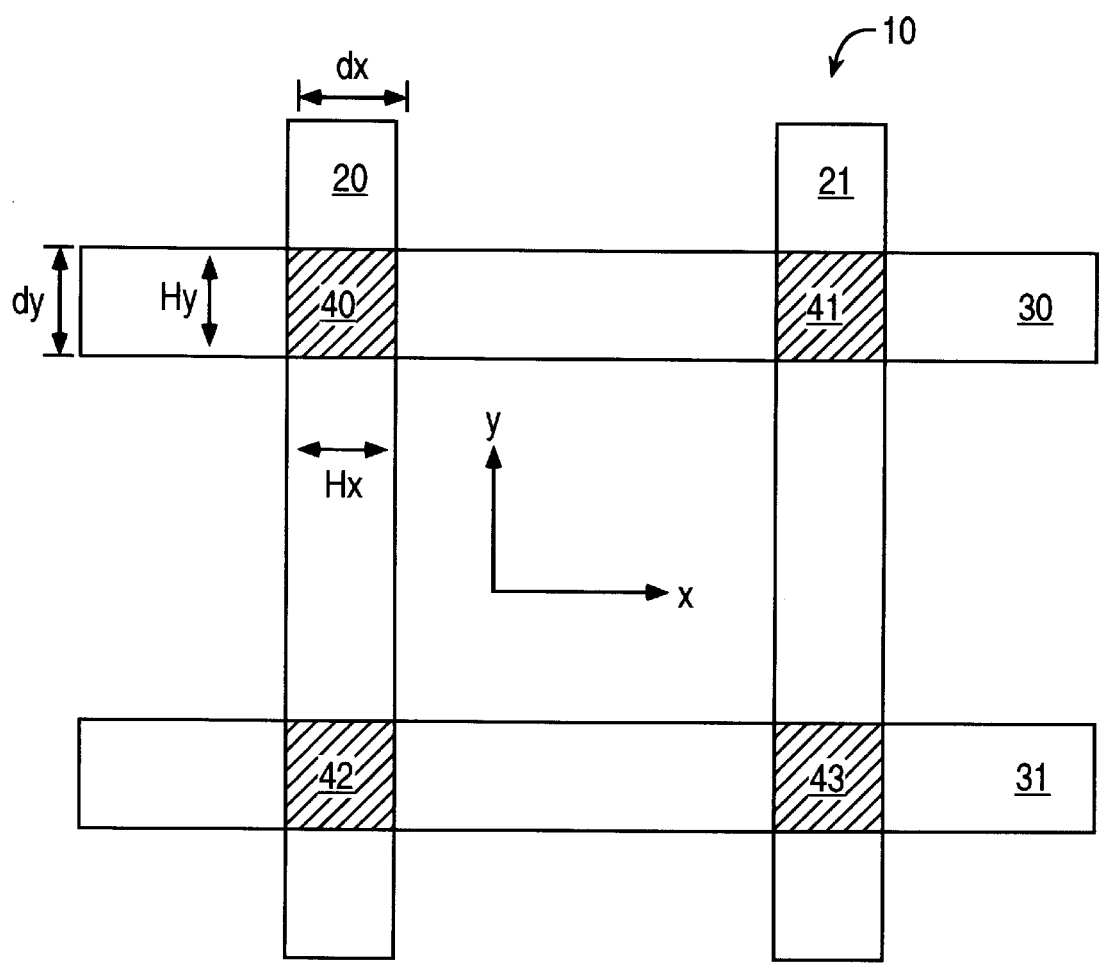
FIG. 4 is a top view of a magnetic memory which includes an array of magnetic memory cells.

FIG. 4 is a top view of a magnetic memory 10 which includes an array of magnetic memory cells comprising the magnetic memory cell 40 along with additional magnetic memory cells 41–43. The magnetic memory 10 also includes an array of conductors 20–21 and 30–31 that enable read and write access to the magnetic memory cells 40–43. The conductors 30–31 are top conductors and the conductors 20–21 are orthogonal bottom conductors. Each of the magnetic memory cells 40–43 has dimensions $d_x$ and $d_y$.

The magnetic memory cells 40–43 are stabilized and their logic states are manipulated by applying electrical currents to the conductors 20–21 and 30–32. For example, an electrical current applied to the conductor 30 in the +x direction causes a magnetic field ($H_{y+}$) in the data storage layer 50 in the +y direction according to the right-hand rule. An electrical current applied to the conductor 30 in the -x direction causes a magnetic field ($H_{y-}$) in the data storage layer 50 in the -y direction. Similarly, an electrical current applied to the conductor 20 in the +y direction causes a magnetic field ($H_{x+}$) in the data storage layer 50 in the +x direction, while an electrical current applied to the conductor 20 in the -y direction causes a magnetic field ($H_{x-}$) in the data storage layer 50 in the -x direction. These induced magnetic fields $H_{x+}$, $H_{x-}$, $H_{y+}$, and $H_{y-}$ may be used to stabilize and/or write the logic state of the magnetic memory cell 40.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A magnetic memory cell, comprising:

data storage layer that stores alterable magnetic fields, the data storage layer having an interior region and a pair of end regions near a pair of opposing edges of the data storage layer;

reference layer having a pinned orientation of magnetization;

material that overlaps the end regions on an upper surface of the data storage layer and that covers the opposing edges of the data storage layer and a pair of opposing edges of the reference layer, the material stabilizing the magnetic memory cell by pinning a magnetization in the end regions to a predetermined direction while providing an insulating layer that prevents electrical coupling between the opposing edges of the data storage layer and the reference layer and one or more conductors that provide read and write access for the magnetic memory cell.

2. The magnetic memory cell of claim 1, wherein the predetermined direction is substantially perpendicular to an easy axis of the data storage layer.

3. The magnetic memory cell of claim 1, wherein the opposing edges are perpendicular to an easy axis of the data storage layer.

4. The magnetic memory cell of claim 1, wherein the material is an antiferromagnetic material that also provides insulating properties.

5. The magnetic memory cell of claim 4, wherein the antiferromagnetic material is nickel-oxide.

6. The magnetic memory cell of claim 4, wherein the antiferromagnetic material is $Fe_2O_3$.

7. The magnetic memory cell of claim 1, wherein the material is a permanent magnet.

8. The magnetic memory cell of claim 1, wherein a logic state is written to the magnetic memory cell using the following steps:

applying a magnetic field that rotates a magnetization in the end regions of the data storage layer to reduce free poles in the end regions;

applying a magnetic field that rotates an orientation of magnetization in the interior region to a desired direction for the logic state.

9. The magnetic memory cell of claim 8, wherein the logic state is written to the magnetic memory cell using the following additional step of applying a magnetic field that reduces free poles in a pair of opposing side regions of the data storage layer prior to applying the magnetic field that rotates a magnetization in the end regions.

10. The magnetic memory cell of claim 8, wherein the logic state is written to the magnetic memory cell using the following additional steps:

removing the magnetic field that rotates the magnetization in the end regions;

removing the magnetic field that rotates an orientation of magnetization in the interior region.

* * * * *